United States Patent [19]

Tabata et al.

[11] Patent Number: 5,043,557
[45] Date of Patent: Aug. 27, 1991

[54] LOAD VOLTAGE DETECTING DEVICE FOR USE IN AN APPARATUS FOR SUPPLYING A CURRENT VARIABLE WITH TIME TO A LOAD SECTION

[75] Inventors: Yoichiro Tabata; Shigeo Ueguri; Yoshihiro Ueda, all of Hyogo, Japan

[73] Assignee: Mitsubishi Denki K.K., Tokyo, Japan

[21] Appl. No.: 373,841

[22] Filed: Jun. 29, 1989

[30] Foreign Application Priority Data

Jun. 29, 1988 [JP] Japan .................................. 63-161303

[51] Int. Cl.$^5$ .......................... B23K 9/09; H01S 3/00
[52] U.S. Cl. .......................... 219/130.51; 219/76.13; 323/234; 324/656; 372/38
[58] Field of Search ................ 219/130.51, 76.13; 324/654, 656; 323/234; 372/38

[56] References Cited

U.S. PATENT DOCUMENTS 4,551,668 11/1985 Kammiller ...................... 323/234

Primary Examiner—Clifford C. Shaw
Attorney, Agent, or Firm—Sughrue, Mion, Zinn, Macpeak & Seas

[57] ABSTRACT

A load voltage detecting device for use in an apparatus for supplying a current variable with time to a load section. The load voltage detecting device for an apparatus such as a pulsed arc welding machine can accurately detect the load voltage from the output voltage of the pulse current supplying section without being affected by the reactor component and the resistance component of the load section and the elements extended to the load section such as the cables and the welding torch.

4 Claims, 13 Drawing Sheets

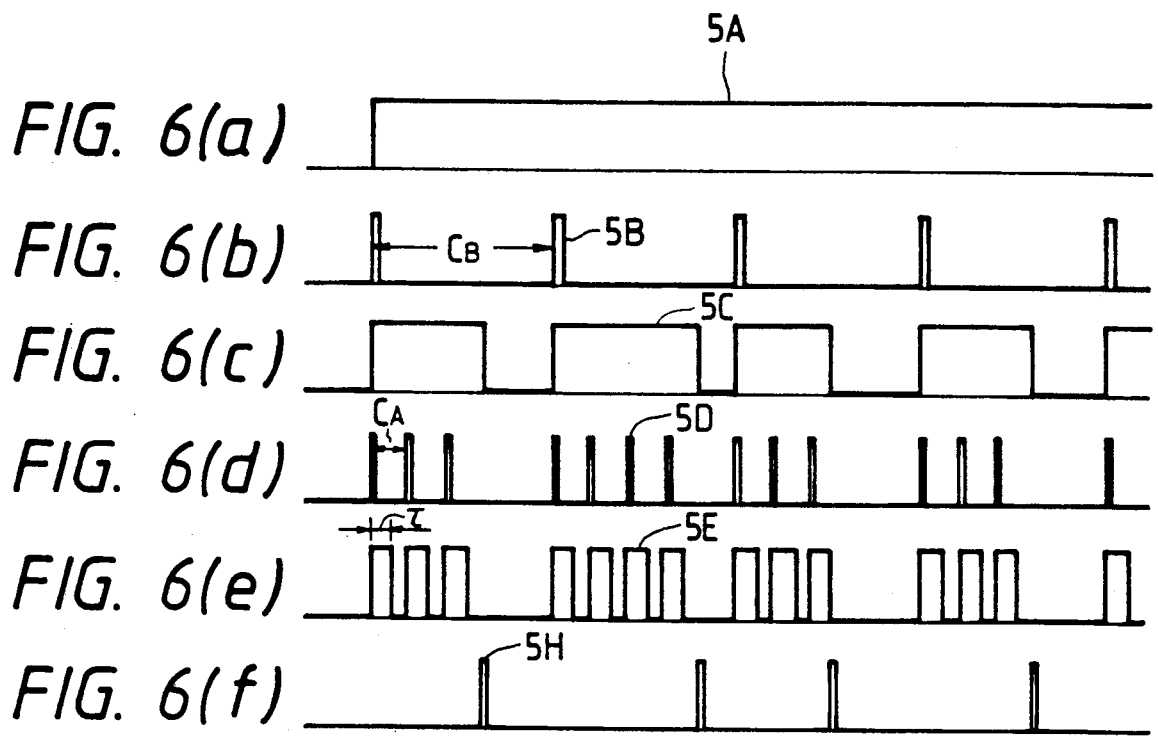
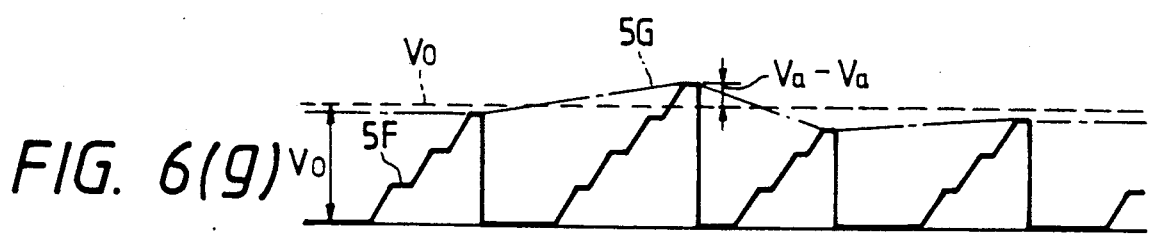
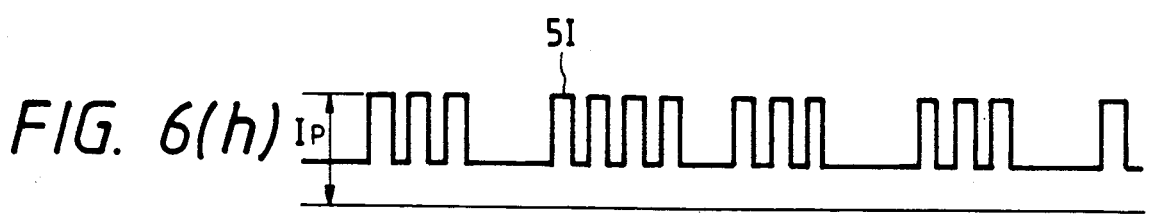

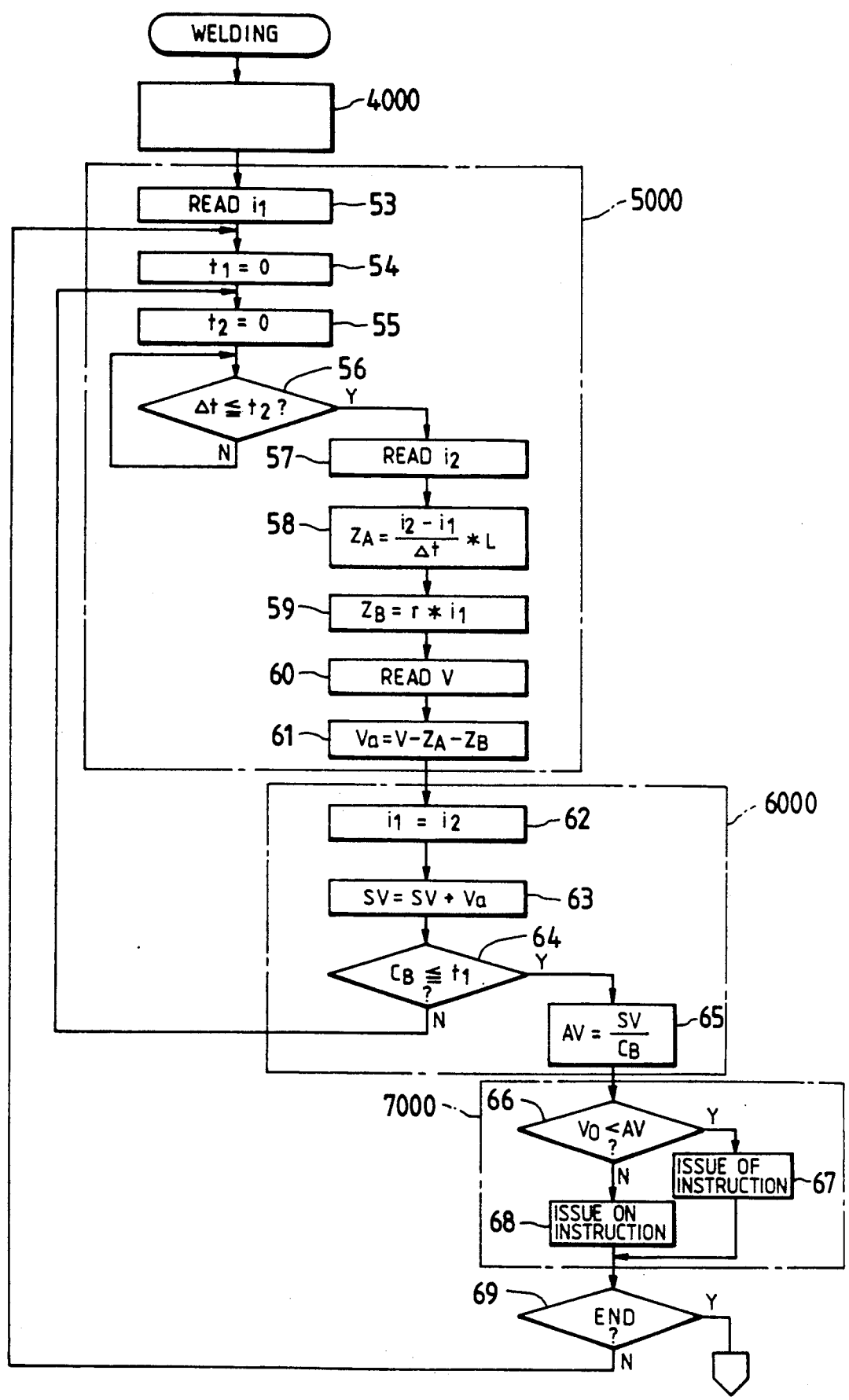

LOAD VOLTAGE DETECTING DEVICE FOR USE IN AN APPARATUS FOR SUPPLYING A CURRENT VARIABLE WITH TIME TO A LOAD SECTION

BACKGROUND OF THE INVENTION

This invention relates to the detection of a voltage across a load in an apparatus using an electric discharge, such as a pulsed arc welding device, a laser device or a surface treating device, and to a device for most suitably controlling the output conditions of the above-described machine and devices by using the voltage detection signal. More particularly, the invention relates to a device for calculating a concerning load voltage such as a discharge voltage from a voltage value containing the reactance and resistance of a current cable, and to means for suitably controlling the above-described machine and devices according to the detected load voltage.

Typical examples of the device of this type operating on electric discharge are an arc welding machine, a laser device employing electric discharge for its exciting source, and a surface treading device utilizing glow discharge. A load voltage detecting device in a pulsed arc welding machine, which is one example of the arc welding machine, will be described.

In a pulsed arc welding machine, a pulsed arc current is allowed to flow between a consumable welding wire electrode (hereinafter referred to merely as "a wire electrode", when applicable) and a material to be welded (or base metal) to cause pulsed arc discharge therebetween. In this operation, the pulsed arc discharge generates heat, which melts the base metal and a filler metal, and the filler metal thus molten is transferred onto the part to be welded by the electromagnetic pinching force of the pulsed arc discharge.

The pulsed arc welding machine will be described in more detail. FIG. 13 shows the arrangement of a conventional pulsed arc welding machine which has been disclosed for instance by Published Unexamined Japanese Patent Application No. 19177/1982. In FIG. 13, reference numeral 1 designates the pulsed arc welding machine; and 2, an arc load section. The pulsed arc welding machine comprises: a pulse current supplying section 3 including DC source 3a, a switching element 3b for chopping current, which is a power transistor element which switches on and off current from the DC source 3a to form a pulse-shaped current waveform, and an arc maintaining power source 3c for supplying a continuous base current to the switching element 3b in order to prevent the difficulty that arcing is discontinued between pulses; a control circuit 5 for controlling the switching element 3b to set the pulse frequency and pulse width of the pulse current to predetermined values; a voltage detector 6 for detecting an output voltage V; a current detector 7 for detecting a current i; a subtractor 8 for subjecting the output voltage V and the output voltage Vo of an arc length setting unit 9 to subtraction and applying the result of subtraction to the control circuit 5; and the arc length setting unit 9.

The arc load section 2 comprises: a welding torch 2a; a wire electrode 2c which is a filler metal in the form of a wire wound on a wire reel; and a material to be welded (or base metal) 2b. A pulsed arc current from the pulsed arc welding machine 1 is supplied through cables 4a and 4b to the arc load section 2.

The operation of the pulsed arc welding machine will be described. In general, with a pulsed arc welding machine, unlike a DC arc welding machine, even when the average current is small, the end portion of the wire electrode 2c is molten by the pulsed arc current, and the end portion thus molten is caused to come off in the form of a molten drop by the electromagnetic pinch force of the pulsed arc current. The molten drops thus formed are intermittently transferred onto the base metal 2b (the transferring being referred to as "spray transfer"), thus achieving the welding operation. Accordingly, the pulsed arc welding machine can perform a welding operation with an average current lower than that in the DC arc welding machine; that is, it can perform the spray transfer welding of a base metal thinner. Thus, the pulsed arc welding machine is advantageous in that the spray transfer welding eliminates the sputtering phenomenon which otherwise may be caused during welding. In a welding operation with the pulsed arc current waveform, arc length control is carried out to prevent the change of an arc length which may be caused by the variation of the welding torch 2a, distortion of the base metal 2b, and the variation of the wire feeding speed. In the arc length control, in general, the output voltage of the pulsed arc welding machine 1 is detected by the voltage detector 6, and the output voltage V thus detected is compared with the output signal Vo of the arc length setting unit 9, and according to the difference signal (Vo−V) therebetween, the pulse width $\tau$ or pulse period $C_B$ is controlled (increased or decreased) thereby to suppress the variation of arc length. More specifically, when the output voltage V is larger than the output signal Vo, then it is determined that the arc length is longer than that in the steady operation, and the pulse width $\tau$ is decreased or the pulse period $C_B$ is increased to decrease the amount of melting of the wire electrode, under the condition that the amount of control is in proportion to the absolute value of the difference signal (Vo−V). When, in contrast, output voltage V is smaller than the signal Vo, then it is determined that the arc length is shorter, and the pulse width $\tau$ is increased or the pulse period $C_B$ is decreased under the condition that, similarly as in the above-described case, the amount of control is proportional to the absolute value of the difference signal (Vo−V).

In the pulsed arc welding machine thus constructed, the output voltage V detected by the voltage detector 6 is the sum of the arc voltage Va and the voltage drops VL and Vr due to the impedance of the cables 4a and 4b and the welding torch section 2a; i.e., the reactor component L and the resistance component r thereof (V−Va+L·di/dt+ri); that is, the output voltage V is not the true arc voltage Va. Therefore, as the frequency of the pulse current waveform increases, L·di/dt corresponding to the reactance voltage $V_L$ is increased os that $V_L$ occupies a larger part of the output voltage V. As a result, it becomes difficult for the output voltage to suppress the variation of the arc length which may be caused by the variation of the welding torch, the distortion of the base metal, etc.; that is, it becomes difficult to perform the arc length control stably, and accordingly the welding performance is greatly lowered. In addition, the reactor component L and the resistance component r, depending on the length of the cables, affect $V_L$ (=L·di/dt) and Vr (=ri).

SUMMARY OF THE INVENTION

Accordingly, an object of the present invention is to eliminate the above-described difficulties accompanying a pulse arc welding machine, and to provide a load voltage detecting device for use in an apparatus for supplying a current variable with time to a load section.

Another object of the present invention is to provide a load voltage detecting device for a pulsed arc welding machine which can accurately detect the load voltage from the output voltage of the pulse current supplying section without being affected by the reactor component and the resistance component of the load section and the elements extended to the load section such as the cables and the welding torch.

A further object of the present invention is to provide a pulsed arc welding machine in which the above-described load voltage detecting system is employed to accurate detect the load voltage from the output voltage of the pulse current supplying section without being affected by the reactor component and the resistance component of the load section and the elements extended to the load section such as the cables and the welding torch, whereby the arc length control is greatly improved.

A still further object of the present invention is to provide a pulse laser device in which, although in the prior art the electrode configuration and the reactor L and resistance r of the electrode connecting terminals make it impossible to accurately detect the laser exciting source or discharge voltage, namely, the load voltage Va in real time, the load voltage Va can be accurately detected substantially in real time with the above-described load voltage detecting system, whereby the power density or field condition of the laser exciting source depending on the discharge voltage Va is determined, and the discharge gas pressure or gas purity or load current can be controlled.

The other object of the present invention is to provide a surface treating device in which, although in the prior art the electrode configuration and the reactor L and resistance r of the electrode connecting terminals make it impossible to accurately detect a discharge load voltage for forming a film, namely, the load voltage Va in real time, the latter Va can be accurately detected substantially in real time with the above-described load voltage detecting system, whereby, during surface-treated, the electrode surface temperature, and the discharge section pressure are determined thereby to control the load current (or gas pressure or gas purity) of the surface treating device.

The above, and other objects of the present invention are accomplished by the provision of:

(1) A load voltage detecting device for use in an apparatus for supplying current variable with time to a load section comprising:

short-circuiting means for short-circuiting a load section;

sampling means for sampling at two time points the value of a current provided when said load section is short-circuited;

memory means for calculating a reactor L and a resistance r according to the difference signal of the current values thus sampled, and storing the reactor L and resistance r thus calculated; and calculating means for sampling a current supplied when a load current is supplied, and calculating corresponding voltage values $V_L$ and $V_r$ from said reactor L and resistance r thus stored, and obtaining a load voltage by subtracting said corresponding voltage values from an output voltage value detected;

(2) A pulsed arc welding machine comprising:

a pulse current supplying section for applying an arc current to a wire electrode and a material to be welded which form a load section;

an arc length setting unit for outputting a voltage corresponding to a set arc length;

a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and calculating means for sampling a current supplied when a load current is supplied, and calculating corresponding voltage values $V_L$ and $V_r$ from said reactor L and resistance r thus stored, and obtaining a load voltage by subtracting said corresponding voltage values from an output voltage value detected, a control circuit for controlling, according to the difference between a load voltage detected by said load voltage detecting system and said output voltage of said arc length setting unit, an arc current outputted by said pulse current supplying section so that arcs produced be constant;

(3) A pulse laser device comprising:

a pulse current supplying section;

a voltage setting unit for setting an output in advance;

a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and a control circuit for controlling, according to the difference between a load voltage detected by said load voltage detecting system and an output voltage of said voltage setting unit, a load current which is applied to a laser exciting source by said pulse current supplying section; and (4) A surface treating device comprising:

a pulse current supplying section;

a voltage setting unit for setting an output voltage in advance;

a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and a control circuit for controlling, according to the load voltage detected by said load voltage detecting means, a load current which is applied to a device for forming a film on a material by pulse discharge which is to be surface-treated.

In the load voltage detecting system according to the present invention, with the load section short-circuited in advance, the reactance and resistance of the concerned machines' terminals and cables are automatically calculated, and the load current provided when a load is connected thereto is sampled at all times, so that the voltage value detected is corrected into the true load voltage in real time.

In the pulsed arc welding machine according to the present invention, the load current is controlled according to the load voltage detected by the load voltage detecting system and the voltage preset, so that even when the frequency of the load current is increased, the arc length is maintained constant and the discharge is stabilized accordingly.

In the pulse laser device according to the present invention, the load current (gas pressure and gas purity) is controlled according to the load voltage and the preset voltage, so that the laser output is stabilized more effectively, and the output laser beam is improved in quality.

In the surface treating device according to the present invention, the surface treatment is controlled with the load current (gas pressure and gas purity) according to the load voltage and the preset voltage, so that the surface treatment is uniform and is substantially free from defects.

BRIEF DESCRIPTION OF THE DRAWINGS

In the accompanying drawings:

FIGS. 6(a) through 6(h) are times charts showing various control signals in the control circuit shown in FIG. 5;

FIG. 12 is a flow chart for a description of the operation of the load voltage detecting system which is so modified as to be operated on a program;

DESCRIPTION OF THE PREFERRED EMBODIMENTS

Embodiments of the present invention will be described with reference to the accompanying drawings.

Figure 1:
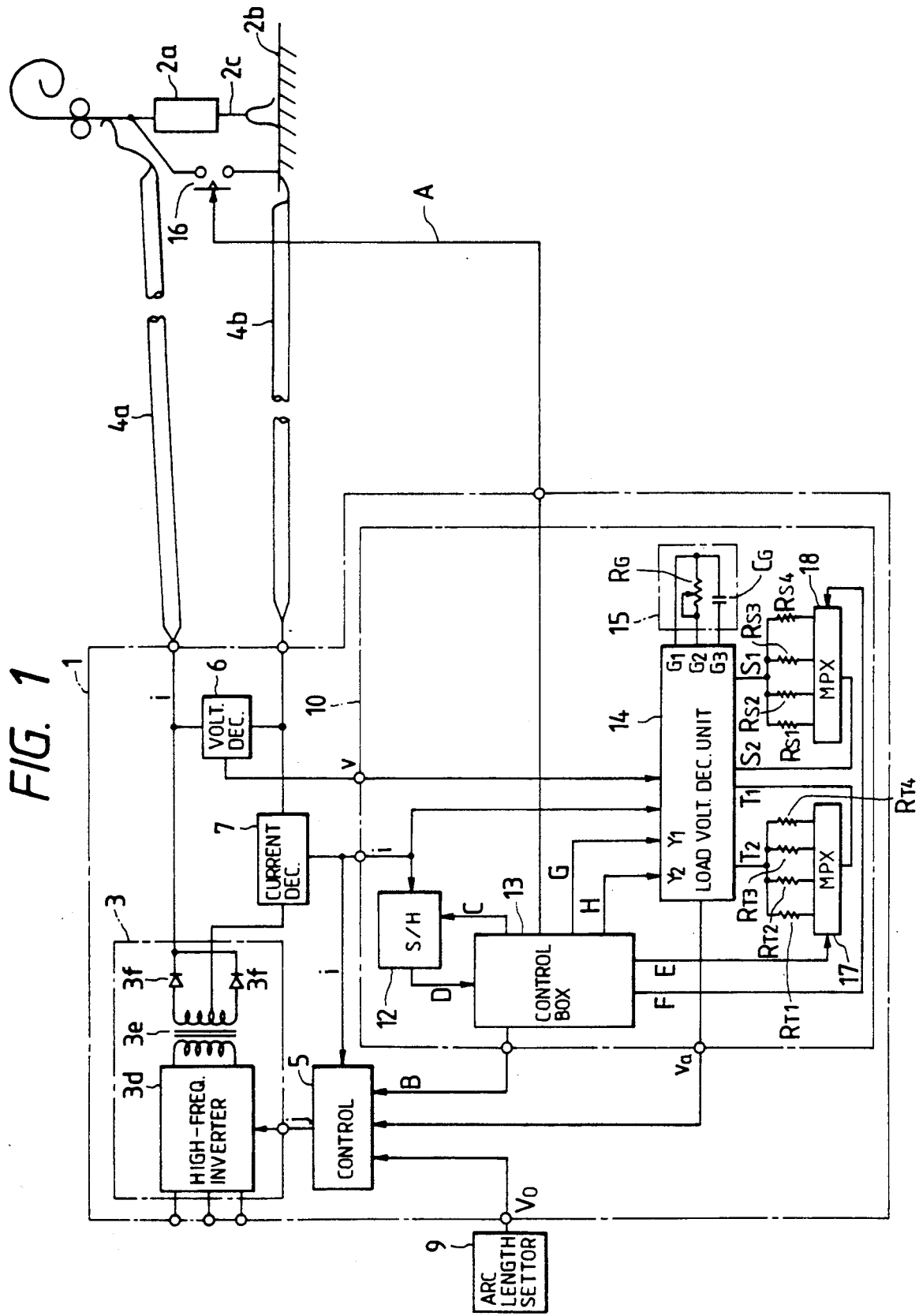
FIG. 1 is explanatory diagram, partly as a block diagram, showing a pulsed arc welding machining a load voltage detecting device; according to the present invention.
Figure 13:
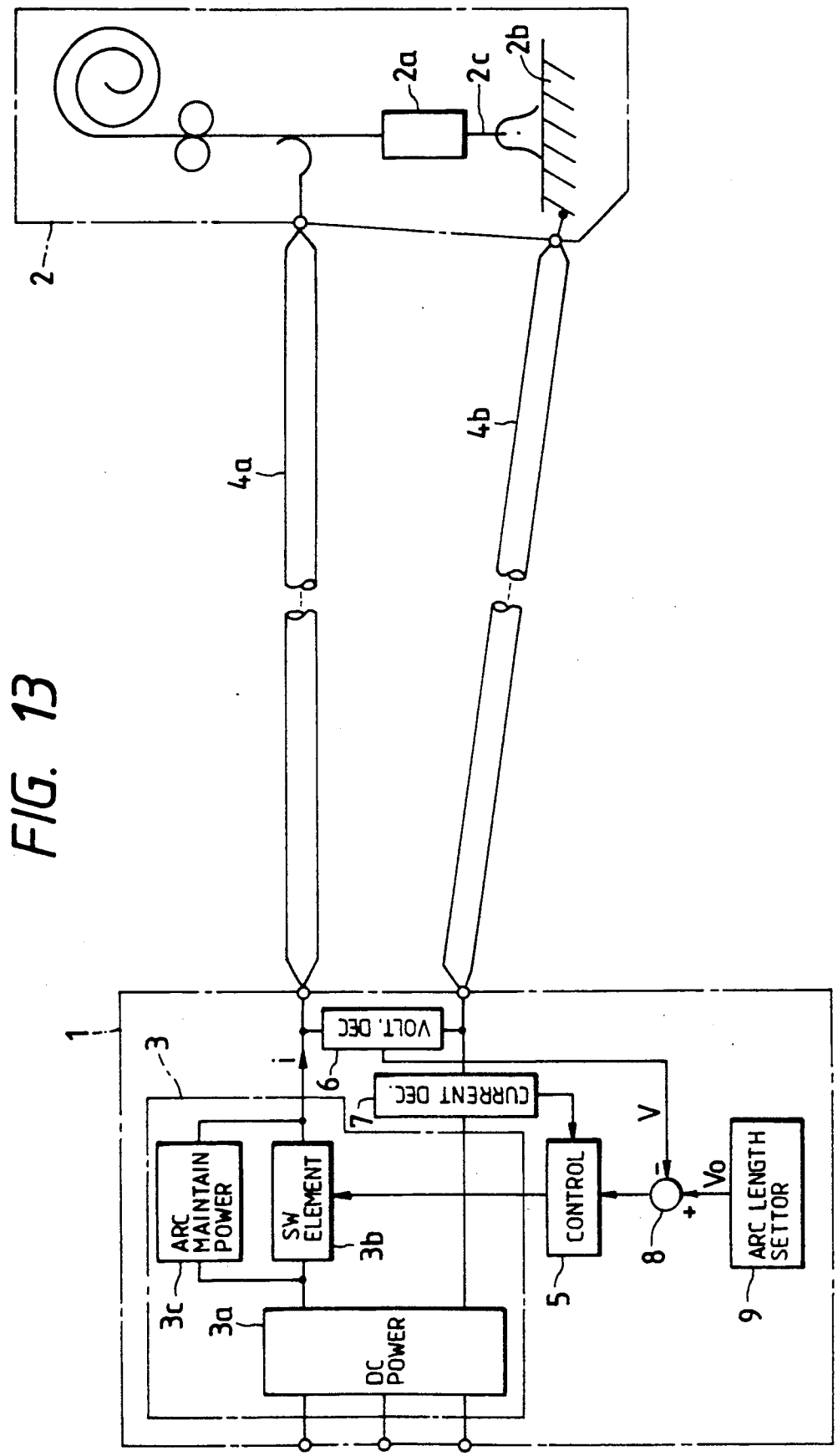
FIG. 13 is an explanatory diagram, partly as a block diagram, showing the arrangement of a conventional pulsed arc welding machine.

FIG. 1 shows a pulsed arc welding machine using a load voltage detecting device according to the present invention. In FIG. 1, those components which have been described with reference to FIG. 13 are therefore designated by the same reference numerals or characters. The pulsed arc welding machine 1, as shown in FIG. 1, comprises: a pulse current supplying section 3 including a high frequency inverter 3d, a boosting high frequency transformer 3e and rectifying high frequency diodes 3f; a control circuit 5 for applying a switching signal to the high frequency inverter 3d; a voltage detector 6; a current detector 7; and a load voltage detecting system 10 which not only performs arc length control (described later) but also measures and set the circuit reactance and resistance of the cables, electrodes, etc.

Figure 3:
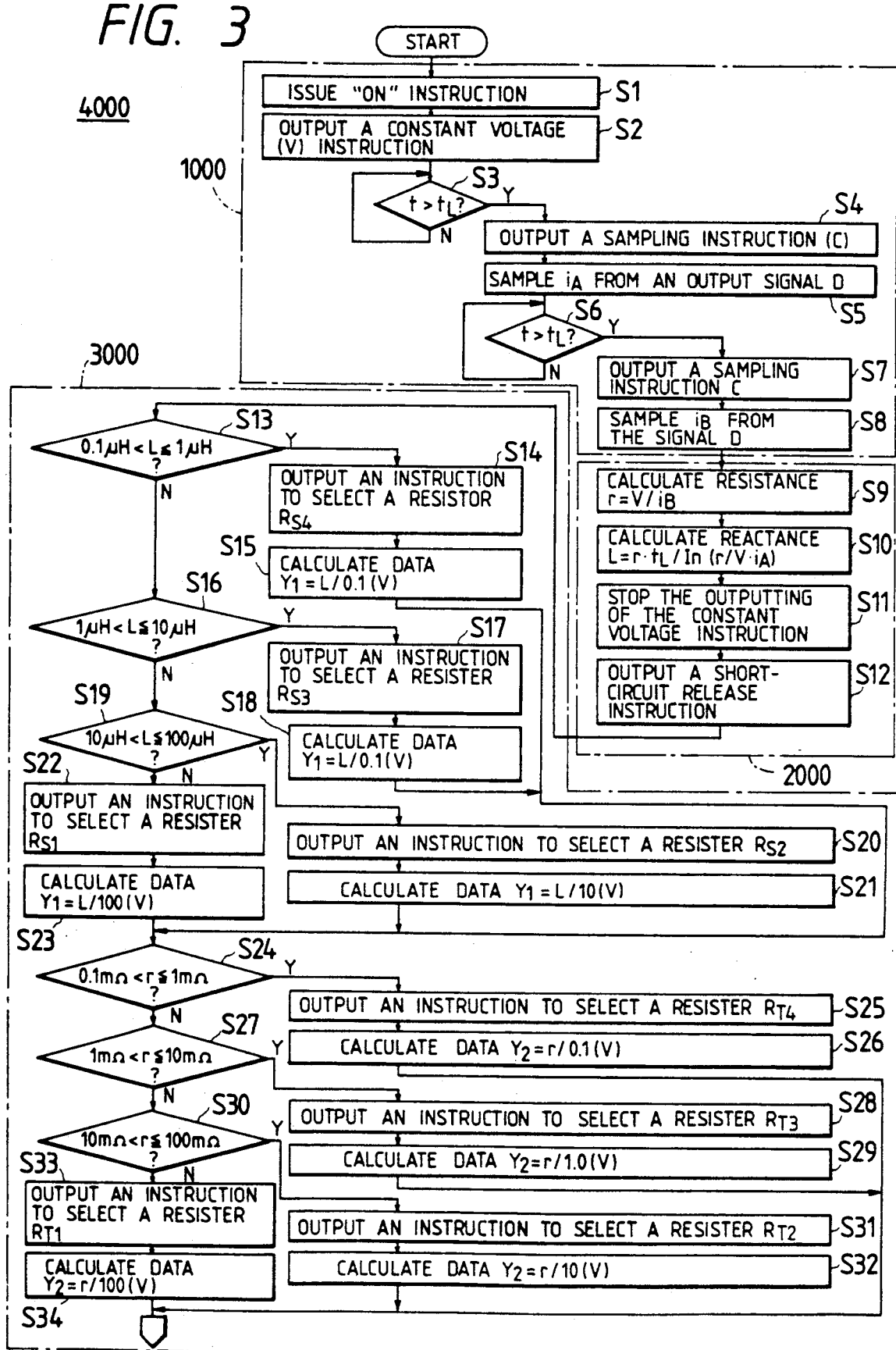
FIG. 3 is a flow chart showing the operation procedure of a control box in the load voltage detecting device.

The load voltage detecting system 10 comprises: a sampling circuit 12 which, in response to a sampling instruction, samples the current detected by the current detector 7 for the period specified; a control box for performing operations according to a flow chart shown in FIG. 3 a load voltage detecting unit which sets resistances $R_T$, $R_S$ and $R_G$ according to the detection voltage V of the voltage detector 6, the detection current of the current detector 7 and output signals G and H of the control box 13; an oscillation frequency setting unit 15 having a resistor $R_G$ and a capacitor $C_G$ to set the clock frequency of the load voltage detecting unit 14; a switch 16 for short-circuiting the load section in response to a control instruction A from the control box 13; a multiplexer 17 for selecting one of the resistors $R_T$ connected between terminals $T_1$ and $T_2$ of the load voltage detecting unit 14 in response to a control signal E from the control box 13; and a multiplexer 18 for selecting one of the resistors $R_S$ connected between terminals $S_1$ and $S_2$ of the load voltage detecting unit 14 in response to a control signal F from the control box 13.

Figure 2:
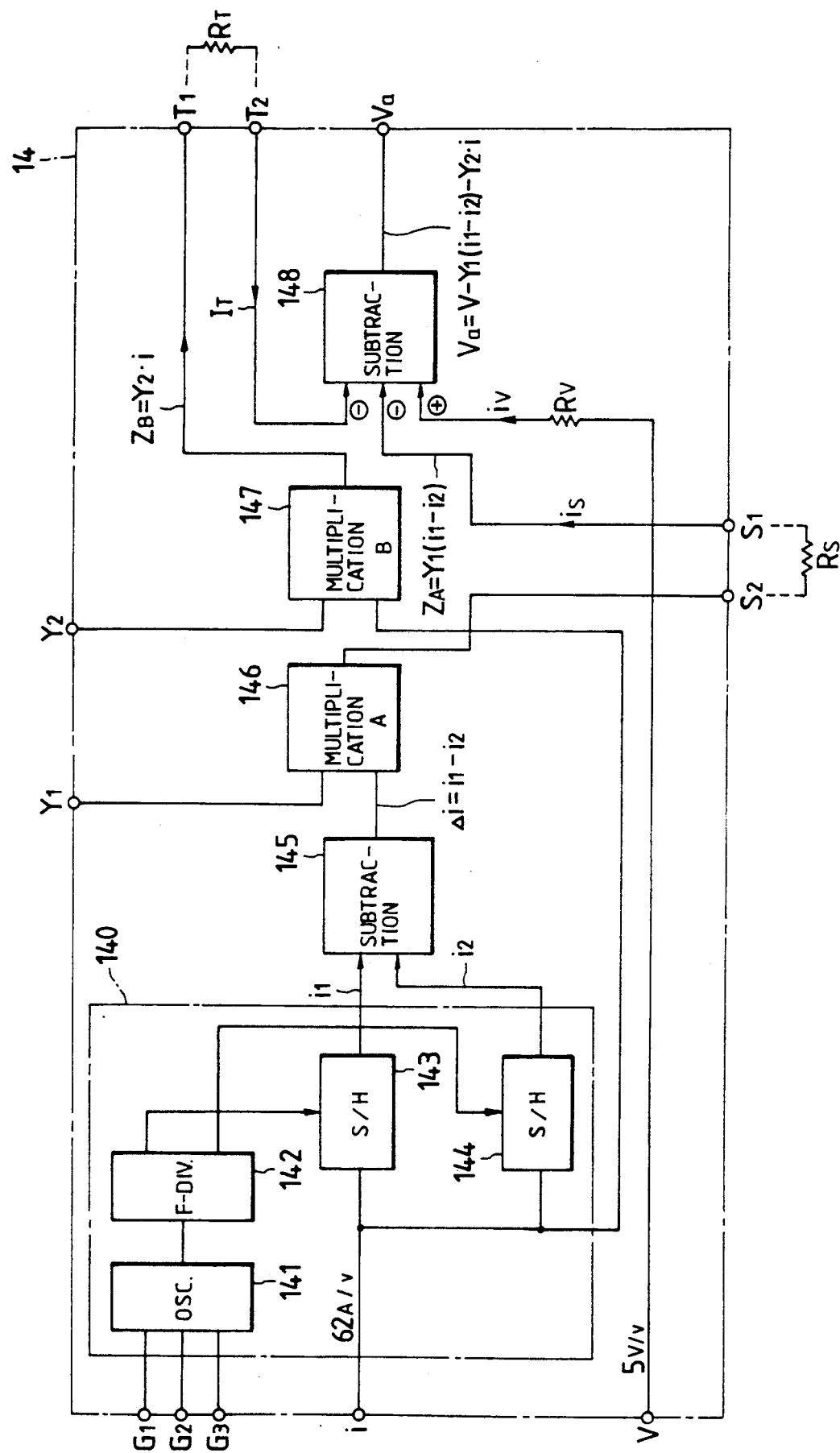
FIG. 2 is a block diagram showing a load voltage detecting unit in the load voltage detecting device according to the present invention.

FIG. 2 shows the arrangement of the load voltage detecting unit 14 in more detail which is made up of an IC. In FIG. 2, reference numeral 140 designates a sampling unit for sampling the current detected by the current detector at all times, the sampling unit 140 comprising an oscillation section 141, a frequency division section 142, and sample and hold circuits 143 and 144; $G_1$, $G_2$ and $G_3$, input terminals to which the circuit resistor $R_G$ and the circuit capacitor $C_G$ are connected to set a sampling pulse frequency; 145 and 148, subtraction section for subjecting input signals to subtraction; 146 and 147, multiplication section A and B for subjecting input signals to multiplication; i, a terminal for receiving a load current signal detected; V, a terminal for receiving an output voltage detected; $Y_1$ and $Y_2$, terminals for applying voltages to the multiplication sections A and B, respectively; $T_1$ and $T_2$, and $S_1$ and $S_2$, terminals between which circuit resistors $R_T$ and $R_S$ are connected to select currents $i_t$ and $i_s$ which are to be applied to the subtraction section 148, respectively; and Va, the output terminal of the IC, to provide a load voltage signal.

The operation of the pulsed arc welding machine thus organized will be described.

FIG. 3 is a flow chart showing an operating procedure in which, in the control box 13, the inductance component L and resistance component R of the cables 4a and 4b and the welding torch section 2a are caluclated before a welding operation, signals are applied to the load voltage detecting unit 14 according to the values thus calculated. In FIG. 3, reference numeral 1000 designates a current measurement block for measuring the rise of current; 2000, an arithmetic operation block for calculating circuit reactance and resistance components; and 3000, a selection block for selecting a circuit constant for the load voltage detecting unit according to the reactance and resistance.

Figure 4:
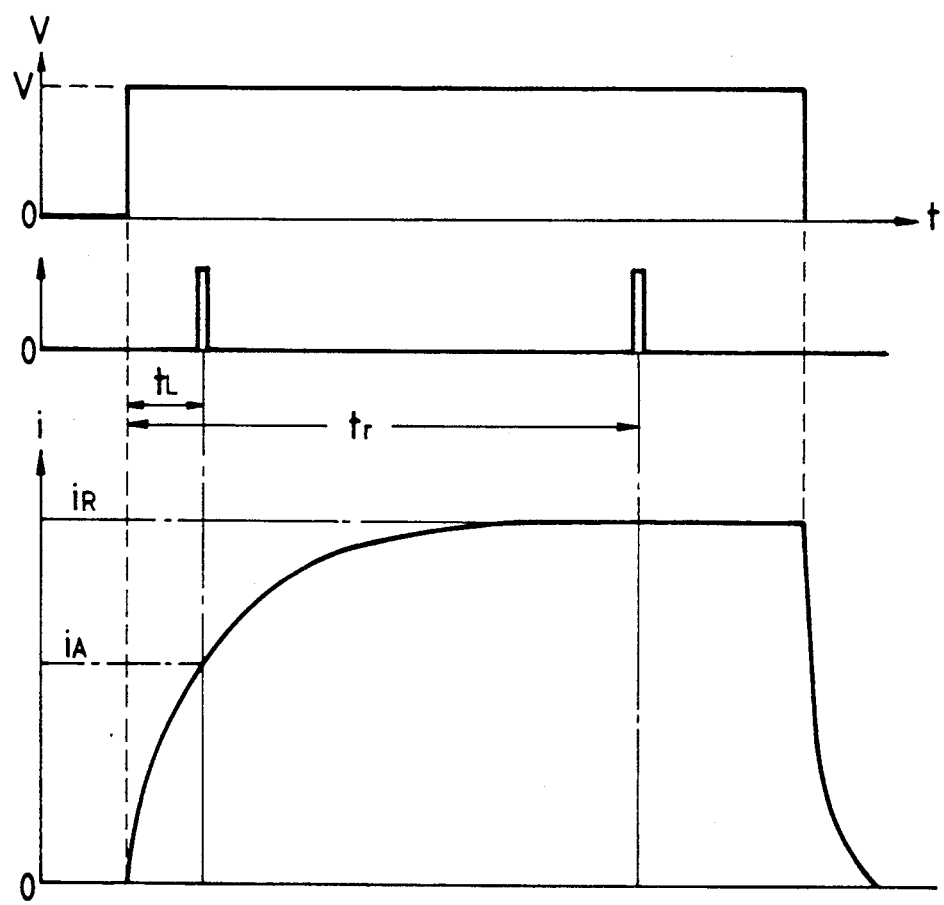
FIG. 4 is a time chart for a description of the detection of a short-circuit current.

In the current measurement block 1000, with the switch 16 (FIG. 1) short-circuited, as shown in FIG. 4 a constant voltage V is applied, and the resultant current is detected; more specifically, the current $i_A$ which is rising, and the current $i_B$ which has reached a predetermined level are detected by sampling.

The current measurement block 1000 will be described in more detail. In step S1, and "ON" instruction is issued, so that the switch 16 is turned on, to short-circuit the arc load section 2. In step S2, an instruction B is applied through the control circuit 5 to allow the pulse current supplying section 3 to output the constant voltage V. When a predetermined period of time $t_L$ has passed since the provision of the constant voltage V in step S2 (step S3), step S4 is effected. In step S4, an instruction C is applied to cause the sampling circuit 12 to sample the current value provided by the current detector 7. In step S5, with the aid of the output signal D of the sampling circuit 12, the current $i_A$ sampled is applied to the control box 13. In step S6, a predetermined period of time $t_r$ is allowed to pass after the provision of the constant voltage in step S2, then, step S7 is effected. In step S7, an instruction C is issued to cause the sampling circuit 12 to sample the current value provided by the current detector 7 again, the current $i_B$ thus sampled is applied to the control box 13.

The transient response of the circuit thus short-circuited can be represented by the following equation:

$$V = L \, di/dt + r \cdot i$$

The current i due to the transient response is:

$$i = V/r[(1 - \exp(-r/L \cdot t)]$$

From this equation, the reactance and resistance can be obtained.

That is, in the arithmetic operation block 2000, the reactor L and resistance r are calculated by using the currents $i_A$ and $i_B$ which are obtained in the current measurement block 1000.

The arithmetic operation block 2000 will be described in more detail. In step S9, the operation of resistance $r = V/i_B$ is carried performed. In step S10, the resistance r, the current $i_A$, and the rise time $t_L$ are utilized to perform the operation of circuit reactance $L = r \, t_L/[\ln(1 - r/V \, i_A)]$. In step S11, an instruction is issued to stop the outputting of the pulse current supplying section 3. In step S12, the switch 16 is turned off; that is, a short-circuit release instruction is issued.

In the selection block 3000, the reactor L and the resistance r obtained in the arithmetic operation block 200 are used to determine circuit voltages $Y_1$ and $Y_2$, and circuit constants $R_S$ and $R_T$. The load voltage Va is represented by the following expression:

$$Va = V - L \times di/dt + r \times i$$

In the expression, L and r are employed as circuit variables which are specified by external circuit voltage and resistance, because the reactor L and resistance r of the cables and the welding machine depend greatly on the conditions of installation of the welding machine and its construction. More specifically, the variable L and r are divided into four variable, namely, mantessa variables $Y_1$ and $Y_2$ and exponent variables $\alpha$ and $\beta$. That is, L and r are replaced by $Y_1$, $Y_2$, $R_S$ and $R_T$ as follows, so that a voltage Va corresponding to the true load voltage is outputted:

$$Va = V - L \, di/dt + ri$$

where $L = Y_1 \times 10^\alpha$ [$\mu$H]; $d/dt = \Delta I$; $r = Y_2 \times 10^\beta$ [m$\Omega$]; $\alpha \propto R_V/R_S$; and $\beta \propto R_V/R_T$ $I_S = V/R_V - Y_1 \cdot \Delta i/R_S - Y_2 \cdot i/R_T = i_V - i_S - i_T$.

In these expressions, $Y_1$ is the voltage value corresponding to the mantessa value of the reactor L, $Y_2$ is the voltage value corresponding to the mantessa of the resistance r, $\alpha$ is the component with the reactor L indicated in $\mu$H, $\beta$ is the component with the resistance r indicated in m$\Omega$, and $R_V$, $R_S$ and $R_T$ are the circuit resistance which set the input current $i_V$, $i_S$ and $i_T$ of the subtractor 148 in FIG. 2. The data $i_S$ is the sum of input currents of the subtractor 148. The subtractor 148 outputs the voltage Va proportional to the input current $i_S$. The exponent $\alpha$ is proportional to $R_V/R_S$, and $\beta$ is proportional to $R_V/R_S$.

Figure 9:
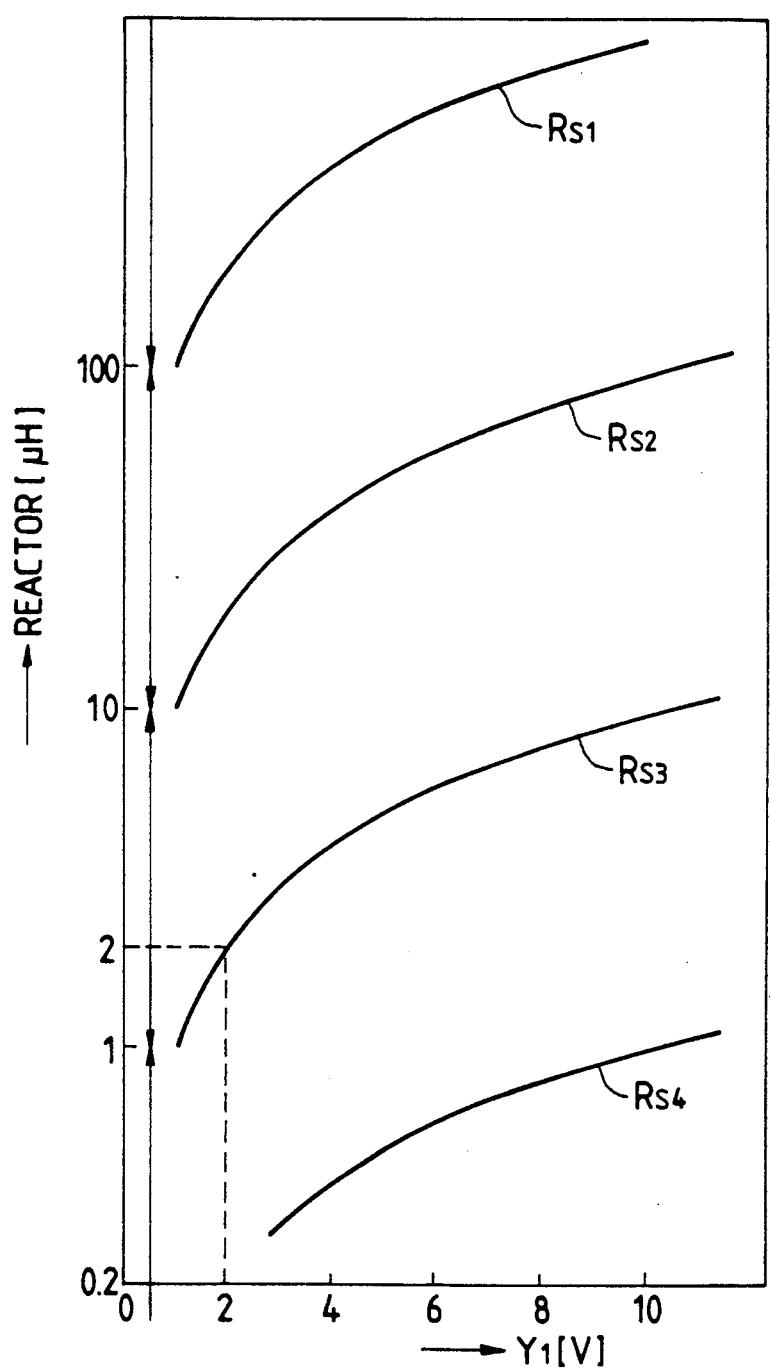
FIGS. 9 and 10 are characteristic diagrams showing the relationships between reactors L and predetermined voltages $Y_1$ of a multiplier A in the load voltage detecting system FIG. 1; and the relationship between resistances r and predetermined voltages $Y_2$ of the multiplier A, respectively.
Figure 10:
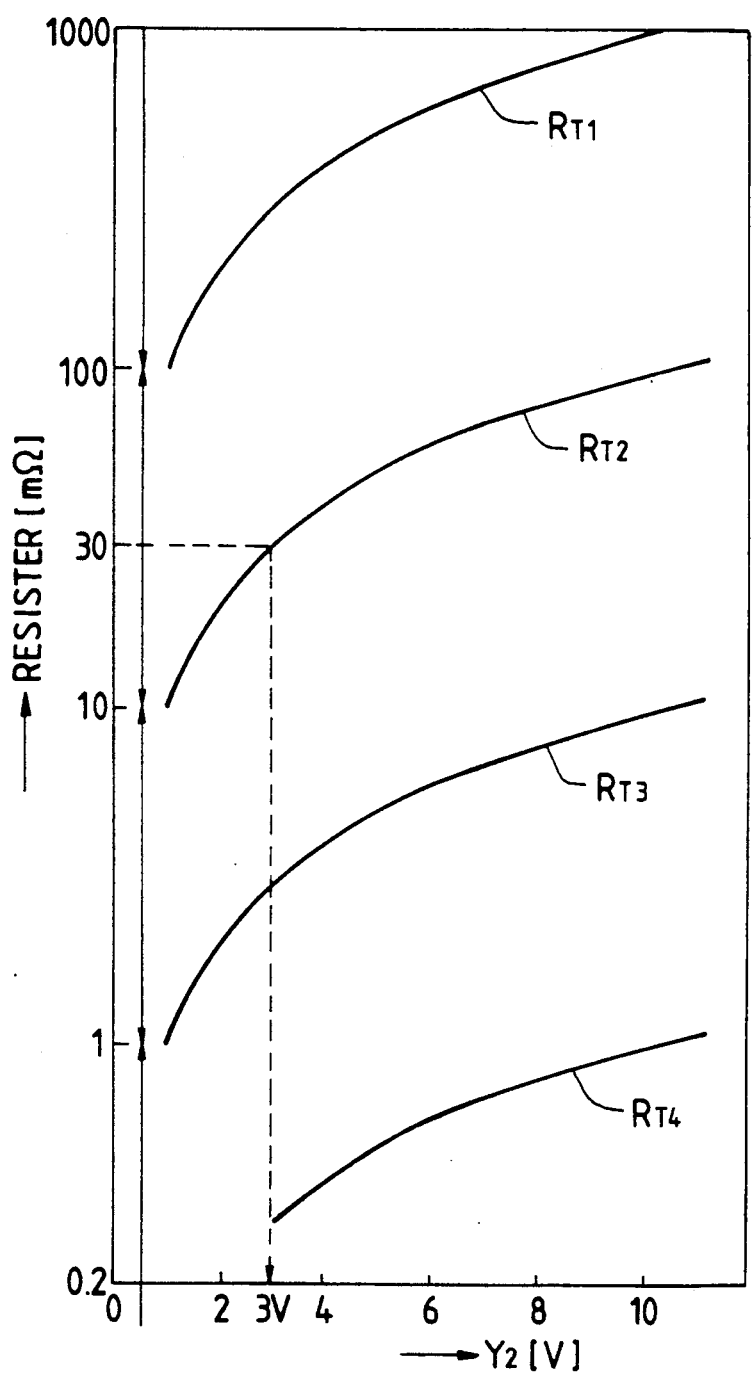

FIGS. 9 and 10 are characteristic diagrams showing the fact that the exponents $\alpha$ and $\beta$ change $-1, 0, 1, 2$ and so on when $R_S$ and $R_T$ are made to be $R_{S1} < R_{S2} < R_{S3} < R_{S4}$, and $R_{T1} < R_{T2} < R_{T3} < R_{T4}$, respectively, with $R_V$ set to a certain value. The actions of $Y_1$, $Y_2$, $R_V$, $R_S$ and $R_T$ will be described later.

In the load voltage detecting unit (FIG. 2) in the embodiment of the first invention, it is necessary to select $R_S$ and $Y_1$, and $R_T$ and $Y_2$ according to the reactor L and the resistance r as shown in FIGS. 9 and 10. This selection is performed in the selection block 3000.

First in step S13, it is determined whether or not the reactor L is in a range of 0.1 $\mu$H to 1 $\mu$H. If the result of determination is "YES", then in step S14 an instruction is applied to a the multiplexer 18 so as to select the resistor $R_{S4}$, and in step S15 the data $Y_1$ is calculated from the reactor L and applied to the load voltage detecting unit 14. Thereafter, step S24 is effected. If, in step S13, the result of determination is "NO", then in step S16 it is determined whether or not the reactor L is in a range of 1 $\mu$H to 10 $\mu$H. If the result of determination is "YES", then in steps S17 and S18 operations are carried out in the same manner as in the described steps S14 and S15, and step S24 is effected. If, in step S16, the result of determination is "NO", then step S19 is effected. In step S19, it is determined whether or not the reactor L is in a range of 10 $\mu$H to 100 $\mu$H. If the result of determination is "YES", then steps S20 and S21 are effected. If the result of determination is "NO", then in steps S22 and S23 operations are carried out in the same manner as in steps S14 and 15, and then step S24 is effected. In step S24, it is determined whether or not the resistance r is in a range of 0.1 to 1 m$\Omega$. If the result of determination is "YES", then in step S25 an instruction is applied to the multiplexer 17 so as to select the resistor $R_{T4}$, and in step S26, the data $Y_2$ is calculated from the resistance r. Then, the execution of the program is ended.

If, in step S24, the result of determination is "NO", then in step S27 it is determined whether or not the resistance r is in a range of 1 to 10 mΩ. If the result of determination is "YES", then in steps S28 and S29 operations are performed in the same manner as in steps S25 and 26, and the execution of the program is ended. If the result of determination in step S27 is "NO", then in step S30 it is determined whether or not the resistance r is in a range of 10 to 100 mΩ. If the result of determination is "YES", then in steps S31 and S32 operations are performed in the same manner as in steps S25 and S26; and if it is "NO", then in steps S33 and S34 operations are carried out in the same manner as in steps S25 and S26, and the execution of the program is ended.

Now, the operation of the load voltage detecting unit 14 shown in FIG. 2 will be described.

The pulse frequency of the oscillation section 141 has been determined by means of the resistor $R_G$ and the capacitor $C_G$ of the oscillation frequency setting unit 15 in advance. In addition, according to the reactance of the cables, the voltage $Y_1$ and the correcting resistance $R_S$ between the terminals $S_1$ and $S_2$ have been determined by the multiplexer 18, while according to the resistance of the cables, the voltage $Y_2$ and the correcting resistance $R_T$ between the terminals $T_1$ and $T_2$ have been set by the multiplexer 17. Under these conditions, a detection value i corresponding to a welding arc current value, and a detection voltage V corresponding to an output voltage including the reactor and resistance of the cables and the welding machine are applied to the load voltage detecting unit 14 at all times.

In the sampling unit 140, the output pulse signal of the oscillation section 141 is divided into two pulse signals by the frequency division section 142, and the two pulse signals are applied, as sampling signals, to the sample and hold sections 143 and 144. The sample and hold sections 143 and 144 sample and hold detection values $i_1$ and $i_2$ corresponding to arc currents provided when the sampling pulse signals are applied thereto, respectively, and supply them to the subtraction section 145. The subtraction section 145 provides the differential output of the detection values $i_1$ and $i_2$. In other words, the subtraction section 145 applies to the multiplication section A 146 the differential output $\Delta i = i_1 - i_2$ which corresponds to the variation of the arc current during the pulse period $\Delta T$ of the oscillation section 141. In the multiplication section A 146, the differential output value $\Delta i$ corresponding to the variation of the arc current and the voltage $Y_1$ corresponding to the mantissa value of the reactance of the cables are subjected to multiplication, and the result of multiplication is applied to the subtraction section 148; that is, the $Z_A = Y_1 \cdot \Delta i$ of the voltage signal $(Y_1 \times 10^\alpha) \times \Delta i$ corresponding to L di/dt is outputted. On the other hand, in the multiplication section B 147, the detection value corresponding to the arc current detected and the voltage $Y_2$ corresponding to the mantissa value of the resistance of the cables are subjected to multiplication, the result of which is applied to the subtraction section 148; that is, the $Z_B = Y_2 \cdot i$ of the voltage signal $(Y_2 \times 10^\beta)$ corresponding to the voltage drop (r·i) due to the resistance of the cables is outputted. And the subtraction section 148 outputs the signal which is provided by subtracting the voltage $Y_1 \cdot \Delta i$ and $Y_2 \cdot i$ from the load voltage V.

That is, the subtraction section 148 outputs the output voltage VBa proportional to the input current $i_S = i_V - i_S - i_T$. This will be described in more detail. The value $i_V$ is obtained by dividing by the resistance $R_V$ the detection voltage V which corresponds to the output voltage including the reactor L and resistance r of the cables and the welding machine $(i_V = V/R_V)$; $i_s$ is obtained by dividing the output voltage $Z_A (= Y_1(i_1 - i_2))$ of the multiplication section A 146 by the resistance $R_S$ $(i_S = Z_A/R_S)$; and $i_T$ is obtained by dividing the output voltage $Z_B (= Y_2 \cdot i)$ of the multiplication section B 147 by the resistance $R_T$ $(i_T = Z_A/R_T)$. Therefore, the load voltage Va is proportional to the following data $i_S$:

$$Va \propto i_S (\approx i_V - i_S - i_T)$$

$i_S$ is determined by $R_V$, $R_S$ and $R_T$ as follows:

$$i_S = V/R_V - Z_A/R_S - Z_A/R_T$$

Thus, it follows that the voltage $Va = AV - BZ_A - CZ_B$ corresponding to $(Va = V - L \cdot di/dt - r \cdot i)$ is outputted. In other words, then the multiplication parts $10^\alpha$ and $10^\beta$ of $(Y_1 \times 10^\alpha)$ and $(Y_2 \times 10^\beta)$ can be optionally set by determining $i_S$ and $i_S/i_V$ with respect to $i_S$, and $i_t(i_T/i_V)$ with respect to $i_V$ with the circuit of FIG. 4. In this case, $i_S/i_V$ corresponds to $R_S/R_V$, and $i_T/i_V$ corresponds to $R_T/R_V$. Accordingly, if, in FIGS. 9 and 10, the characteristics corresponding to the reactor L and resistance r measured in advance are selected with $\mu H$ and $m\Omega$ as parameters, then circuit resistance $R_S$ and $R_T$ and the circuit voltages $Y_1$ and $Y_2$ can be determined.

With respect to the operation of an electric discharge unit of the second invention, an arc length control system according to pulsed arc current waveform control for a pulsed arc welding machine using the load voltage detecting system, which is one embodiment of the second invention, will be described. In the pulsed arc welding machine, a pulse current as shown in FIG. 11 is applied to weld the wire electrode 2c and the base metal 2b (FIG. 1). The pulse current as shown in FIG. 11 is supplied through the high-frequency inverter 3d in FIG. 1. In arc discharge, the length of arc is proportional to the arc voltage if the environmental conditions of the arc discharge section are constant. That is, the length of arc can be held constant is the arc voltage is maintained unchanged.

Figure 11A:
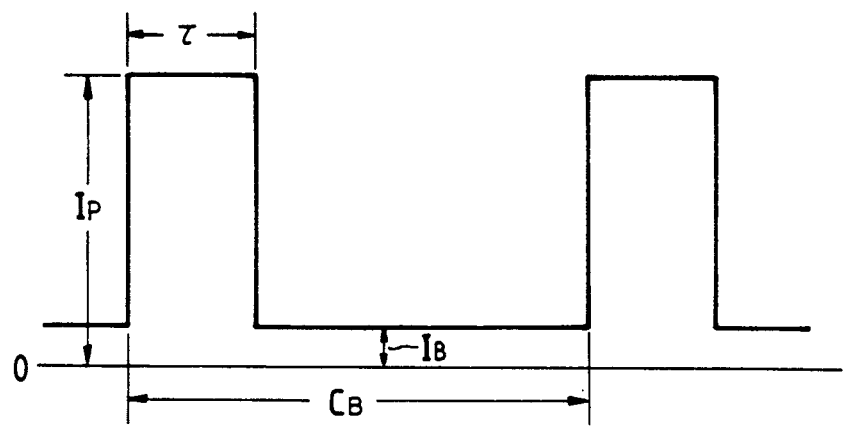
FIGS. 11(a) and 11(b) are waveform diagrams showing pulse currents in the pulsed arc welding machine of the present invention.
Figure 11B:
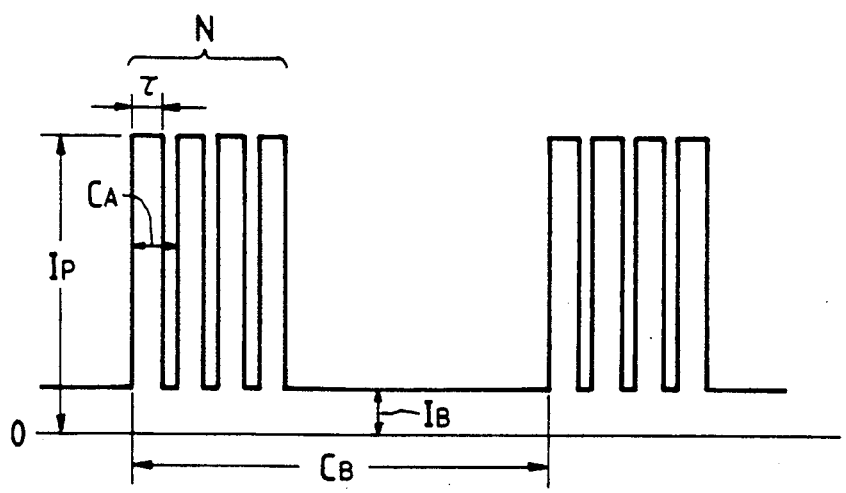

A voltage Vo corresponding to an arc length to be set is set by the arc length setting unit 9 in advance. With the load voltage detecting system of the first invention, the welding arc voltage signal Va is detected at all times. The signal Va is compared with the voltage Vo corresponding to the arc length. According to the comparison, the load current is controlled so as to increase or decrease pulse waveform parameters such as pulse width $\tau$, pulse period $C_B$, pulse peak value $I_P$, base current value $I_B$ and pulse number N as shown in FIGS. 11(a) and 11(b), whereby the arc voltage Va is maintained constant in average. As a result, the arc length is maintained constant.

Figure 5:
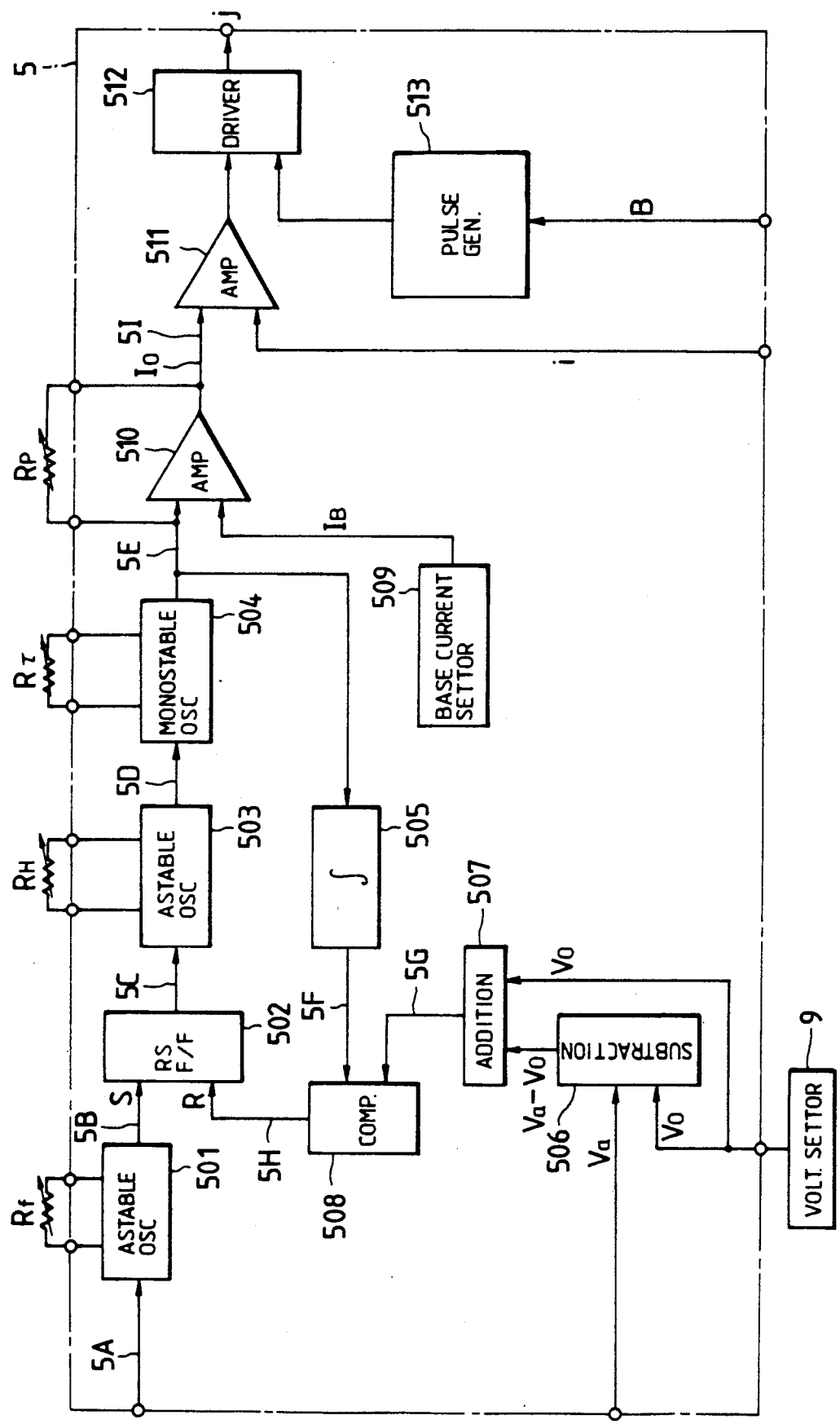
FIG. 5 is a block diagram showing a control circuit 5 in FIG. 1 which is used to control the length of arc.

The operation of the pulsed arc welding machine will be described with respect to the control circuit 5 in more detail which controls the load current by using the number of pulses N according to the load voltage Va and the set voltage Vo. The control circuit 5 is shown in FIG. 5 in detail. The operation of the control circuit 5 will be described with reference to FIGS. 6(a) through 6(h).

First, in response to a start signal 5A (FIG. 6(a)), an astable oscillation section (astable flip-flop) 501 operates. Its output signal 5B is a pulse signal (FIG. 6(b)) which is applied to an RS flip-flop circuit 502 with a period $C_B$ which is determined by a variable resistor $R_f$. In the RS flip-flop circuit 502, its output signal 5C (FIG. 6(c)) is raised to "H" level by the pulse signal 5B, and it is set to "L" level by a pulse signal 5H (FIG. 6(f)). The output signal 5C is applied to an astable oscillation section (astable flip-flop circuit) 503. The latter 503 applies a pulse output signal 5D (FIG. 6(d)) to a mono-stable oscillation section 504 with an oscillation period $C_A$ which is determined by a variable resistor $R_H$, during a period for which the signal 5C is at "H": level. In the mono-stable oscillation section 504, the pulse width $\tau$ of the of the pulse output signal provided every period of the output signal 5D is set with a variable resistor $R_\tau$, so as to provide an output signal 5E (FIG. 6(e)). The output signal 5E is applied to an amplifier 510 and an integration section 505. The latter 505 applies a signal 5F to a comparison section 508 which is obtained by integrating the output signal 5E with time. In the comparison section 508, the signal 5F thus integrated is compared with a signal 5G. When the signal 5F is larger than the signal 5G, the output signal is raised to "H" level, and at the same time the signal 5F integrated is reset (cf. FIG. 6(g)). The output signal 5H of the comparison section 508 is applied to the reset input terminal of the RS flip-flop circuit 502. The above-described signal 5G is outputted by an addition section 507. That is, in the addition section 507, the signal Vo of the arc length setting unit 9 is added to the difference voltage (Va−Vo) provided by subtracting Vo from Va detected, to output the signal 5G. The output signal of the mono-stable oscillation section 504 and the output signal $I_B$ of a base current setting section 509 are applied to the amplifier 510, so that the input signals 5E and $I_B$ are combined and amplified to form a signal 5I (FIG. 6(h)). The amplification factor, and accordingly the pulse current $I_P$ is adjusted with a variable resistor $R_P$, and the output signal 5I is compared with the actual arc current i detected by the current detector 7. And an instruction is applied to the high frequency inverter 3d so that the arc current i approaches the output signal 5I.

Thus, with the above-described circuit, the variation of the load voltage Va is prevented by controlling the number of pulses of the current waveform; i.e., the load current.

As was described above, in the embodiment shown in FIG. 1, with the load section short-circuited in advance, the reactance and resistance components of the cables and the welding machine can be automatically calculated, and the voltage value detected by sampling the load current provided when the welding machine is loaded is corrected into the true load voltage. In addition, the load voltage detecting system controls the load voltage according to a load voltage detected and a voltage preset, whereby even when the frequency of the load current is increased, the arc length can be held constant with high accuracy, and accordingly the electric discharge can be stabilized.

As was described with reference to FIG. 2, the load voltage detecting unit is provided in the form of an IC using semiconductor devices. Therefore, the load voltage detecting unit is compact in structure, and in addition, the signals can be applied according to the impedance of the cables merely by changing the voltages applied to the terminal of the IC and the circuit resistances. And the place for installation of the load voltage detecting unit can be readily obtained.

As is apparent from FIG. 3, the operation of automatically detecting the impedance of the components which are not the functional ones of the welding machine is programmed, and therefore the impedance can be detected readily and directly. The signals and the circuit resistances can be selected suitably according to the impedance detected by the load voltage detecting unit.

A pulse laser device using the load voltage detecting system, will be described. More specifically, means for making the laser output constant and stabilizing it will be described with reference to FIG. 7.

Figure 7:
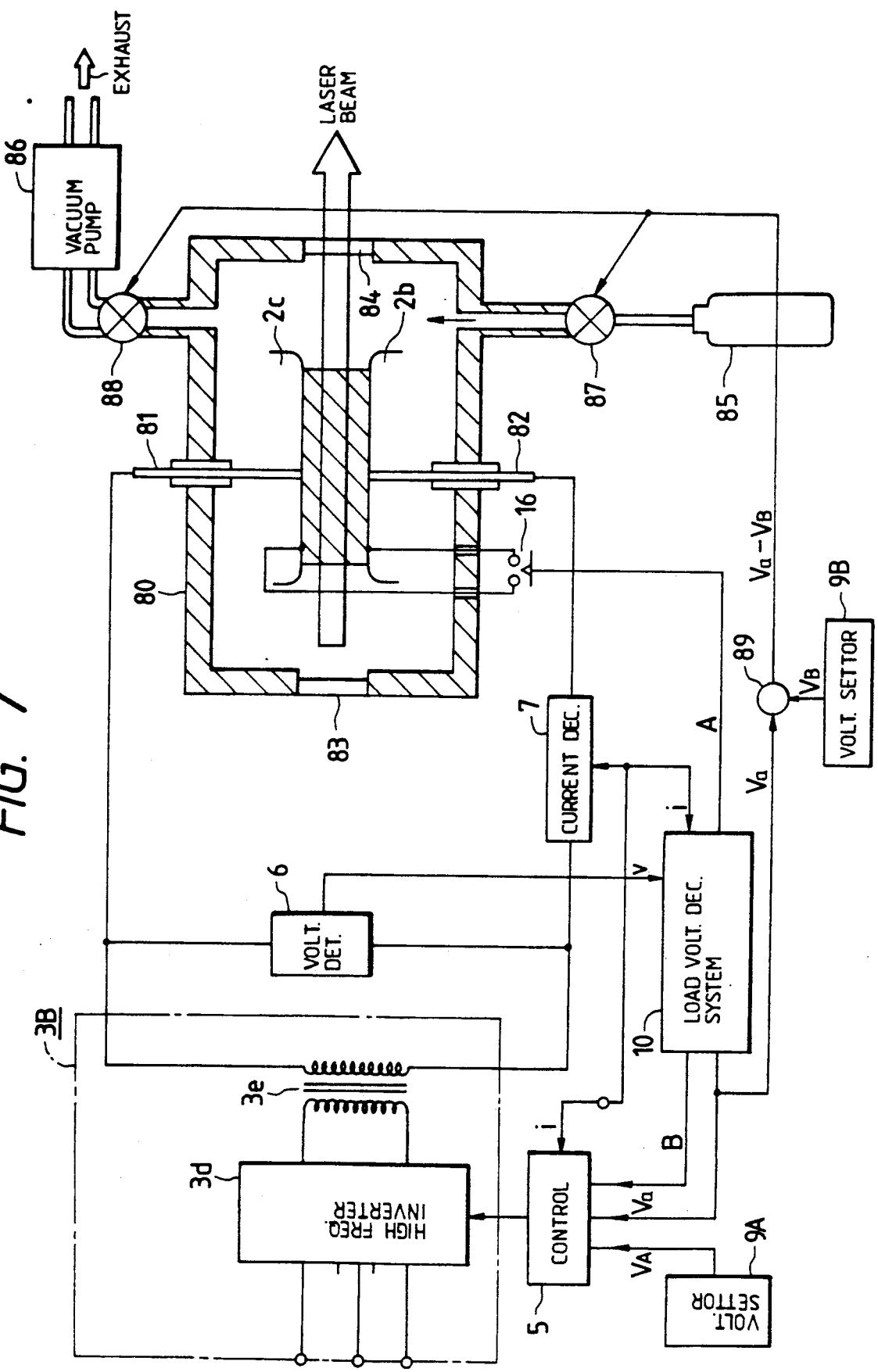
FIG. 7 is an explanatory diagram, partly as a block diagram, showing the arrangement of a pulse laser device according to the present invention which employs the load voltage detecting system of FIG. 1.

In FIG. 7, reference numeral 80 designates a discharge chamber forming a laser exciting source; 81 and 82, electrode connecting terminals for supplying current to discharge electrodes 2b and 2c; 83 and 84, laser beam resonance mirrors for emitting the light by stimulation which is excited by resonance of the light which is produced by electric discharge, thereby to generate a laser beam; 85, a cylinder having a discharge gas which forms the laser exciting source; 86, a vacuum pump for discharging the discharge gas deteriorated; 87 and 88, valves for controlling the discharge gas pressure in the discharge chamber 80; 89, a comparator for outputting the difference voltage between a load voltage Va and a set voltage $V_B$; 10, a load voltage detecting system operating in the same manner as that shown in FIG. 1, receiving a detection current i and a detection voltage V, and outputting a signal B, load voltage Va and signal A; and 9A and 9B, voltage setting units. The other circuit elements in FIG. 7 are equal to those in FIG. 1.

In the pulse laser device thus constructed, for instance a KrF gas is injected into the discharge chamber 80 from the cylinder 86, and it is excited by pulsed arc discharge caused between the electrodes 2b and 2c. When the KrF gas thus excited is placed in ground state, it emits light. The light thus emitted is subjected to resonance by the laser beam resonance mirrors 89 and 84, so as to be amplified. The light thus amplified is the laser beam. The pulse laser has a pulse current supplying section 3B as a power source to cause the pulsed arc discharge. The pulsed arc current should be of a considerably steep waveform. In order to make the laser output constant and to provide it stably, it is necessary to stabilize the excitation (pumping) of the gas thereby to place it in ground state smoothly. For this purpose, it is necessary to sufficiently control not only the electric field of pulsed arc discharge but also the gas temperature and gas pressure at the discharge region.

The electric field of pulsed arc discharge, and the gas temperature and gas pressure at the discharge region correspond closely to the discharge voltage. For instance, as the electric field strength decreases, the discharge voltage is decreased; as the gas temperature increases, the discharge voltage is decreased, and as the gas pressure increases, the discharge discharge voltage is, in general, increased. Thus, it is essential to monitor the discharge voltage so that the laser output be optimum. As was described above the waveform of the pulsed arc current is considerably steep, and therefore it is not suitable to disregard the voltage drop caused between the pulse current supplying section 3B and the electrodes 2b and 2c; that is, L di/dt cannot be disregarded, as a result of which it is impossible to accurately detect the discharge voltage.

In the pulse laser device thus constructed, the load voltage (arc voltage) Va is detected with the load voltage detecting system 10m of the first invention, the pulse current waveform is controlled so that the load voltage Va approaches the set voltage Va which is selected best, and the load voltage Va is compared with the set voltage $V_B$. According to the result of comparison, the flow rate of the gas injected into the discharge chamber 80 is controlled with the valves 87 and 88, so that the gas pressure in the discharge chamber 80 is controlled or the gas deteriorated with impurities is removed therefrom. Thus, the output laser beam can be stabilized.

If summarized, in the pulse laser device of FIG. 7, according to the load voltage Va detected by the load voltage detecting system and the preset voltages $V_A$ and $V_B$, the load current (gas pressure and gas purity) of the laser exciting source is controlled, thereby to make the laser output constant, and to stabilize it.

Figure 8:
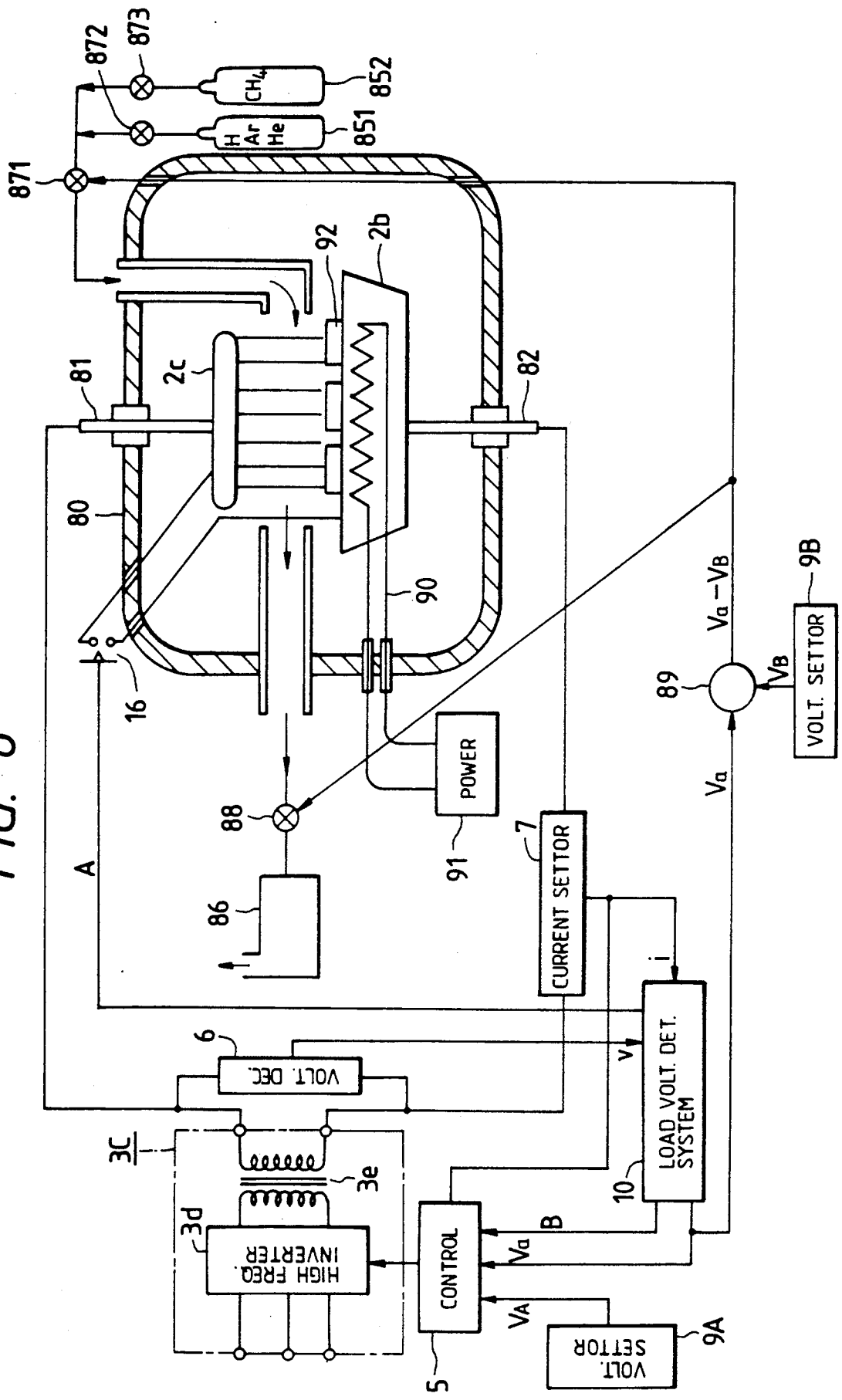
FIG. 8 is an explanatory diagram, partly as a block diagram, showing the arrangement of a surface treating device according to the present invention using the load voltage detecting system of FIG. 1.

Now, a surface treating device using a load detecting device according to the present invention will be described with reference to FIG. 8. The surface treating device employs the load voltage detecting system so as to make a diamond film formed by arc discharge uniform and minimize the defects thereof. In FIG. 8, those components which have been previously described with reference to FIG. 7 are therefore designated by the same reference numerals or characters. In FIG. 8, reference numerals 851 and 852 designates carrier gas cylinders having different discharge gases to form a diamond film by discharge; 872 and 873, valves for adjusting the mixing ratio of the carrier gases; 871, a valve for adjusting the mixing ratio of the gas injected into the discharge chamber 80; 90, a heater for adjusting the temperature of the electrode 2b to accelerate formation of a diamond film; 91, a power source for the heater; and 92, base materials on which diamond films are to be formed.

First, the carrier gases $H_2$—Ar—He and $CH_4$ are injected into the discharge chamber 80 from the carrier gas cylinders 851 and 852 to a pressure of several hundreds of Torr. Under this condition, pulse discharge is continuously induced between the electrodes 2c and 2b, so that the gases are subjected to ionization. The ions formed through the ionization are allowed to collide with one another by the electric field of the pulse discharge, to form hydrocarbon, and the hydrocarbon thus formed is deposited on the base materials, to form the aimed diamond films thereon. In forming a diamond film (hydrocarbon film) high in quality by such a method, it is necessary to use a high-field plasma which is so high in energy density as provided by arc discharge. An effective method of forming a high-field plasma is to supply a pulsed arc current steep in waveform. The power source for inducing the pulsed arc discharge is a pulse current supplying section 3C. In order to deposit the hydrocarbon formed by the high-field plasma high in energy density on the base materials 92 uniformly, it is important to control the gas components in the arc plasma; that is, it is essential to stabilize the gas pressure and the high-field plasma high in energy density (i.e., the pulsed arc discharge).

The gas components, gas pressure and electric field correspond closely to the discharge voltage. For instance, the field strength decreases, the discharge voltage is decreased; and the gas pressure increases, the discharge voltage is generally increased. In addition, the molecular ions of hydrogen gas and hydrocarbon increase, the discharge voltage is increased. Accordingly, in order to form a high-quality film, it is essential to utilize this characteristic; that is, it is important to monitor the discharge voltage.

Thus, in the surface treating device, similarly as in the case of the pulse laser device described above, the load voltage (arc voltage) Va is detected by the load voltage detecting system of the first invention, the pulse current waveform is controlled so that the voltage Va approaches the set voltage $V_A$ which is selected best, and the voltage Va is compared with the voltage $V_B$. According to the result of comparison, the flow rate of the gas to be injected into the discharge chamber is controlled with the valves 871 and 88 while the gas pressure in the discharge chamber 80 and the carrier gas mixing ratio are adjusted. As a result, the films formed on the base materials are uniform and less in the number of defects.

If summarized, in the surface treating device shown in FIG. 8, according to the load voltage Va detected by the load voltage detecting system and the present voltages $V_A$ and $V_B$, the crystal structure on the base material is controlled with the load current (gas pressure and gas purity) during surface treatment, so that the surface treatment of the base material is uniform and is substantially free from defects.

In the above-described embodiment of FIG. 1, the switch 16 is used to short-circuit the load section; however, the wire electrode 2c may be electrically connected to the base metal 2b by moving the welding torch 2a. The oscillation frequency setting unit of the load voltage detecting unit 14 is made up of the resistor $R_G$ and the capacitor $C_G$; however, it may be composed of a crystal oscillator. In the above-described embodiments, the reactor L and resistance of the cables, terminals, etc. are detected; however, the same effect can be obtained by detection of the capacitive reactance C thereof. Furthermore, in the above-described embodiments, the sampling unit 140 in the load voltage detecting unit 14 comprises two sample and hold sections and one frequency division section; however, the same function can be obtained by using one sample and hold section, multiplexer section and latch section.

In the above-described embodiments, the sampling hold section, the load voltage detecting unit 14, the multiplexers 17 and 18, and the voltage comparator 8 are provided as hardware; however, they may be modified as follows: That is, as shown in FIG. 12, a block 4000 which is a block for caucutating circuit variables L and R, contains all of the steps in the blocks 1000, 2000 and 3000 shown in FIG. 3, and instead of the load voltage detecting unit 14, a load voltage calculating block 5000 is employed. The block 5000 is a load voltage calculating block which operates to read a current i and voltage V during an application of load that is, during the welding operation, so that the thus read out current and voltage are subjected to calculation with the circuit variables L and R to obtain a load boltage Va. More specifically, in the block 5000, the following operation is carried out. (1) In the steps 53 to 57, current $i_1$ and $i_2$ are read out each period of $\Delta t$. (2) In the step 58, an approximate value of a voltage drop $Z_A$ (=L·di/dt) due to the circuit reactor L. (3) In the step 59, an approximate value of a voltage drop r·i due to circuit resistance R. (4) in the step 60, a voltage V is read out. (5) In the block 61, the load voltage Va is calculated according to $Va = V - Z_A - Z_A$. Then, a block 6000 for averaging the load voltage Va each period of $C_B$ such as an arc voltage to produce an averaged output AV. More specifically, (1) in the block 62, the current i is made equal to $i_2$. (2) In the step 63, the load voltage is integrated. (3) In the step 64, an integration period is judged. (4) In the block 65, if the integration period is equal to $C_B$, an integrated load voltage SV is devided by $C_B$ to obtain an averaged load voltage AV. A load control block 7000 for controlling the voltage comparator 8 to subject the averaged output AV to comparison with a predetermined aimed value $V_O$ and performing the arc length control are effected successively, so that the necessary operations are carried out according to a program. After the comparison, if $V_O$ is less than the AV, an Off instruction is issued to be applied to the high frequency inverter 3d in the block 67. If $V_O$ is not less than the AV, an On instruction is issued in the block 68 to control the load condition.

In the above-described pulsed arc welding machine, the arc length is controlled; however, it should be noted that the technical concept of the invention is applicable to the arc length control of other electric discharge machines. In the arc length control, the number of pulses N of the load current is changed by the load voltage Va. The same effect can be obtained by controlling the pulse period according to the load voltage Va, or by controlling the load current with the base current value, pulse width or pulse peak value.

In the above described pulse laser device, the exciting source is for arc discharge; however, it may be applied to glow discharge. The exciting source is the pulse discharge current; however, the same effect can be obtained with other than the pulse discharge current.

The surface treating device of the present invention has been described with reference to the formation of a diamond film; however, it should be noted that the technical concept of the invention is applicable to other film treatment devices or nitriding treatment devices. Furthermore, in the invention, the electric discharge is not limited to arc discharge nor pulse discharge.

As was described above, with the load section short-circuited, the reactance and resistance of the cables and terminal of the welding machine can be automatically calculated, and when a load is connected to the machine, the load current can be sampled at all times, so that the voltage detected is corrected into the true load voltage in real time.

In the pulse arc welding machine according to the present invention, the load voltage detected by the load voltage detecting system of the invention is compared with the preset voltage, so that it is so controlled as to approach the preset voltage, thereby to control the arc length. Therefore, even when the frequency of the load current is increased, the arc length can be controlled with high accuracy.

In the pulse laser device, the load voltage detected by the load voltage detecting system is compared with the present voltage, so that the load current is controlled according to the result of comparison. Therefore, the variation in potential gradient of the load due to the electron temperature and gas temperature in the electric discharge providing the laser exiting source can be readily analyzed by the load voltage detecting system. And according to the result of analysis, the load current waveform and the gas pressure can be controlled, and the gas exchange can be determined, with a result that the laser output is stabilized. In addition, with a pulse voltage employed as the present voltage, the pulse laser oscillation can be obtained according to the pulse voltage, and the pulse peak value is made stabler.

In the surface treating device (or discharge machining apparatus), the load voltage detected by the load voltage detecting system is compared with the preset voltage, and according to the result of comparison the load voltage is controlled. Therefore, the variation in potential gradient of the load due to the gas temperature in the electric discharge can be immediately analyzed by the load voltage detecting system. According to the result of analysis, the load current waveform and the gas pressure can be controlled, and the gas exchange can be determined. The surface treating operation, or machining operation can be controlled or performed more stably.

What is claimed is:

1. A load voltage detecting device for use in an apparatus for supplying current variable with time to a load section comprising:
   short-circuiting means for short-circuiting a load section;
   sampling means for sampling at two time points the value of a current provided when said load section is short-circuited;
   memory means for calculating a reactor L and a resistance r according to the difference signal of the current values thus sampled, and storing the reactor L and resistance r thus calculated; and
   calculating means for sampling a current supplied when a load current is supplied, and calculating corresponding voltage values $V_L$ and $V_r$ from said reactor L and resistance r thus stored, and obtaining a load voltage by subtracting said corresponding voltage values from an output voltage value detected.

2. A pulsed arc welding machine comprising:
   a pulse current supplying section for applying an arc current to a wire electrode and a material to be welded which form a load section;
   an arc length setting unit for outputting a voltage corresponding to a set arc length;
   a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and
   calculating means for sampling a current supplied when a load current is supplied, and calculating corresponding voltage values $V_L$ and $V_r$ from said reactor L and resistance r thus stored, and obtaining a load voltage by subtracting said corresponding voltage values from an output voltage value detected a control circuit for controlling, according to the difference between a load voltage detected by said load voltage detecting system and said output voltage of said arc length setting unit, an arc current outputted by said pulse current supplying section so that arcs produced be constant.

3. A pulse laser device comprising:
   a pulse current supplying section;
   a voltage setting unit for setting an output in advance;
   a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and a control circuit for controlling, according to the difference between a load voltage detected by said load voltage detecting system and an output voltage of said voltage setting unit, a load current which is applied to a laser exciting source by said pulse current supplying section.

4. A surface treating device comprising:

a pulse current supplying section;

a voltage setting unit for setting an output voltage in advance;

a load voltage detecting means including short-circuiting means for short-circuiting said load section, sampling means for sampling at two time points the value of a current provided when said load section is short-circuited, memory means for calculating a reactor L and a resistance r according to the difference signal of the current values thus sampled, and storing the reactor L and resistance r thus calculated; and a control circuit for controlling, according to the load voltage detected by said load voltage detecting means, a load current which is applied to a device for forming a film on a material by pulse discharge which is to be surface-treated.

* * * * *